United States Patent
Normoyle et al.

(10) Patent No.: US 9,673,626 B2
(45) Date of Patent: Jun. 6, 2017

(54) REMOTE CONTROL AND OPERATION OF LV DISTRIBUTION NETWORKS

(75) Inventors: Brendan Normoyle, Castlemahon (IE); Aidan Quinn, Ballina (IE); Jean-Christophe Bouche, Ennis (IE); Philip Foxley, Conwy (GB); Leslie Allen, Clacton-On-Sea (GB); Melvyn McGann, Chelmsford (GB); Conor McLoughlin, Limerick (IE)

(73) Assignees: TE Connectivity Ireland Limited, Dublin (IE); Tyco Electronics UK LTD, Wiltshire (GB)

( * ) Notice: Subject to any disclaimer, the term of this patent is extended or adjusted under 35 U.S.C. 154(b) by 715 days.

(21) Appl. No.: 14/111,760

(22) PCT Filed: Apr. 4, 2012

(86) PCT No.: PCT/EP2012/056217
§ 371 (c)(1),
(2), (4) Date: Oct. 14, 2013

(87) PCT Pub. No.: WO2012/139959
PCT Pub. Date: Oct. 18, 2012

(65) Prior Publication Data
US 2014/0035372 A1    Feb. 6, 2014

(30) Foreign Application Priority Data

Apr. 15, 2011   (EP) .................................. 11003205

(51) Int. Cl.
*H02J 1/00*  (2006.01)
*H02J 3/00*  (2006.01)
(Continued)

(52) U.S. Cl.
CPC .............. *H02J 3/00* (2013.01); *G01R 31/088* (2013.01); *H01H 3/00* (2013.01); *H01H 9/542* (2013.01);
(Continued)

(58) Field of Classification Search
CPC .............. H02J 3/00; G01R 31/00; H01H 3/00
(Continued)

(56) References Cited

U.S. PATENT DOCUMENTS 5,786,813 A * 7/1998 Kurikko ................ G06F 1/3218
                                                    345/211
5,818,710 A   10/1998 LeVan Suu
(Continued)

FOREIGN PATENT DOCUMENTS

EP         0034467 A1   8/1981
EP         0089515 A1   9/1983
(Continued)

OTHER PUBLICATIONS

International Preliminary Report on Patentability issued by the International Bureau of WIPO, Geneva, Switzerland, dated Oct. 15, 2013, for related International Application No. PCT/EP2012/056217; 9 pages.
(Continued)

*Primary Examiner* — Carlos Amaya
(74) *Attorney, Agent, or Firm* — Faegre Baker Daniels LLP (57) ABSTRACT

A Low Voltage, "LV", network automation system is provided which enables utilities to remotely identify location of LV faults on their networks, isolate these faults and re-energizing the healthy LV circuit by remote control. The hardware for this system is designed to be retrofitted into existing LV switchgears and panels which enables the network changeover to be done cost effectively and with
(Continued)

minimum interruption to the network. The system also enables utilities to monitor load flows on the LV networks and identify circuits which are overloaded and gives control room operator options for redistribution of network load where possible.

9 Claims, 9 Drawing Sheets

(51) Int. Cl.
    *H04B 3/54*     (2006.01)
    *H01H 9/54*     (2006.01)
    *G01R 31/08*     (2006.01)
    *H01H 3/00*     (2006.01)
    *G01R 19/25*     (2006.01)
    *H02J 13/00*     (2006.01)

(52) U.S. Cl.
    CPC ........... *H04B 3/54* (2013.01); *G01R 19/2513* (2013.01); *H02J 13/0024* (2013.01); *H04B 2203/5441* (2013.01); *H04B 2203/5458* (2013.01); *Y02B 90/2623* (2013.01); *Y02B 90/2692* (2013.01); *Y02E 60/74* (2013.01); *Y02E 60/7823* (2013.01); *Y02E 60/7892* (2013.01); *Y04S 10/30* (2013.01); *Y04S 40/122* (2013.01); *Y04S 40/146* (2013.01); *Y10T 307/477* (2015.04)

(58) Field of Classification Search
    USPC .............................................. 307/1
    See application file for complete search history.

(56) References Cited

U.S. PATENT DOCUMENTS

| | | | |
|---|---|---|---|
| 6,351,083 B1* | 2/2002 | Ten Holter | H02J 13/00 |
| | | | 219/485 |
| 2007/0206644 A1* | 9/2007 | Bertsch | H02J 13/0062 |
| | | | 370/503 |

FOREIGN PATENT DOCUMENTS

| | | |
|---|---|---|
| GB | 2113025 A | 7/1983 |
| WO | WO98/31086 | 7/1998 |
| WO | WO2008/052162 | 5/2008 |

OTHER PUBLICATIONS

International Search Report and Written Opinion issued by the European Patent Office, dated Oct. 10, 2012, for related International Application No. PCT/EP2012/056217; 16 pages.

\* cited by examiner

REMOTE CONTROL AND OPERATION OF LV DISTRIBUTION NETWORKS

TECHNICAL FIELD OF THE INVENTION

The present invention relates to the operation of power distribution networks, and more particularly, to the remote control and operation of low voltage distribution networks.

BACKGROUND OF THE INVENTION

The degree of sophistication and complexity of low voltage (LV) distribution networks, also simply referred to as LV networks, has increased significantly over the past years which has been followed by increasing demands in terms of efficient use of energy, network protection and automation as well as to more stringent safety needs.

For instance, urban low voltage networks in the United Kingdom are supplied from MV/LV substations having a primary voltage of 11 kV and a secondary voltage of 240V. Substation transformers vary in size from 200 kVA to 1 MVA and the 3-phase LV network cables are connected to LV panels with each phase individually fused. Up to 15 network cables can be connected to an individual substation LV panel with 4 or 5 cables being typically connected. Each cable is protected by 3 individual 315 A, 400 A or 500 A J-type fuses and is connected to a number of LV link boxes which are connected in series. Individual customer's service connections are made to the LV network using branch joints onto the network cables between the link boxes.

If there is a fault on the LV network one or more fuses on the affected feeder will blow and clear the fault. Fault restoration involves sectionalising the affected LV network repeatedly by opening or removing wedge style links from the LV link boxes on the network and re-energising the circuit from the LV fuse panel.

However, since all these operations are at the present time still performed manually by a specialized team or technician displaced to the network location, customers may have to wait a number of hours before energy supply can be restored following a LV network fault.

Further, there are currently restrictions on the number of times a cable which has a fault can be energised to minimise risk of injury or further damage to other utilities plant which may be in contact with the faulted cable. In order to reduce the number of customer minutes lost and reduce the penalties imposed by the regulator, utilities have started to add remote control and automation to their MV network and are now examining the options for automation of the LV network.

For instance, published UK patent application GB 2 361 592 A describes a method and apparatus for controlling a portion of an electricity distribution network including conductors, a plurality of network devices cooperating with the conductors to facilitate distribution of electricity, and control apparatus co-located with selected network devices. A detection module for detecting fault conditions is also provided at each of the selected network devices. The distribution network state at each selected network device is monitored by the respective control apparatus and, upon detection of an abnormal condition in the distribution network, one of the control apparatus temporarily assumes coordinating control of the respective network portion. However, since each of the network devices has a dedicated control apparatus and respective detection module, this scheme is not suitable for current LV distribution networks having a high number of link boxes to be monitored and switches to be controlled.

U.S. Pat. No. 6,167,525 describes a method and system for analysing the status of an electric power transmission link and facing unexpected anomalous conditions in the transmission link during the operation of the link itself by timely redefining the thermal evaluation model to these unexpected conditions of the transmission link, in order to determine its instant load carrying capability. The method includes dividing the link into a predetermined number of segments, each segment having an associated prediction model and at least two associated temperature sensors. Upon receiving sensor values, an expected operating condition in one of the segments is determined based on the sensor value and the electric current value. Next, an actual operating condition in the segment is determined and compared with the expected operating condition. If there is a difference between the conditions, a second predetermined prediction model is associated with the segment. This technique is however insufficient for promptly responding to the occurrence of sudden fault events.

SUMMARY OF THE INVENTION

The present invention aims at overcoming the disadvantages and shortcomings of the prior art techniques and an object thereof is to provide a LV network automation system which enables utilities to remotely identify location of LV faults on their networks, isolate these faults and re-energising the healthy LV circuit by remote control, while allowing the change of failed network components to be done cost effectively and with minimum interruption to the network.

A further object of the present invention is to provide a LV network automation system that enables utilities to monitor load flows on the LV networks and identify circuits which are overloaded and gives control room operator options for redistribution of network load where possible.

This object is solved by the subject matter of the independent claims. Advantageous embodiments of the present invention are defined by the dependent claims.

According to the invention it is provided a disconnect switching device, comprising: a latching relay for connecting and disconnecting an AC power signal to a load, a thyristor module connected in parallel with the latching relay, and a control unit for controlling a switching operation of the thyristor module and of the latching relay. The switching operation is controlled by the control unit using a power line carrier control signal transmitted from a remote substation.

A switchgear module for a power distribution network is also provided, comprising: a disconnect switching device according to any one of the preceding claims provided for each phase of a multi-phase AC power signal, a power line carrier receiver for each disconnect switching device and adapted to receive a power line carrier, "PLC", control signal from a remote substation for controlling the disconnect switching device, a master module adapted to communicate with the disconnect switching devices and the power line carrier receivers and to control the disconnect switching devices using the received PLC control signals. If a PLC control signal is not received by a power line carrier receiver, the master module is adapted to control the respective disconnect switching device using a PLC control signal received by another power line carrier receiver.

Further, it is also provided a single phase circuit breaker device, comprising: a thyristor switching device for connecting and disconnecting an AC power signal to a load, and an overcurrent protection device connected in series with the thyristor switching device, for which the overcurrent protection device is adapted to disconnect the AC power signal from the load when a fault current condition occurs at a current value that is above a predetermined threshold value.

The present invention also provides a low voltage panel breaker for a power distribution network comprising the single phase circuit breaker device.

Furthermore, the present invention also provides an automation system for a low voltage distribution network, comprising: the switchgear module and the low voltage panel breaker according to the invention, and a remote terminal unit adapted to remotely control and monitor the link box module and the low voltage panel breaker.

In a further development of the invention, the automation system further comprises a power line control base station, and a communication hub adapted to provide communications between the remote terminal unit with the low voltage panel breaker and/or the link box module.

Hence, the Low Voltage network automation system of the present invention enables utilities to remotely identify location of LV faults on their networks, isolate these faults and re-energising the healthy LV circuit by remote control. This allows utilities to improve their outage statistics and reduce the costs for fault restoration.

Further, the remote control of LV distribution networks according to the invention enables supply to be restored to customers within minutes following a network fault without having to send crews to the site.

Furthermore, the LV network automation system that enables utilities to monitor load flows on the LV networks and identify circuits which are overloaded and gives control room operator options for redistribution of network load where possible. This enables utilities to potentially reduce losses on their LV networks and provides them with the tools to manage integration of renewable energy sources and Electric Vehicles on the LV grid.

According to a further development of the invention, the hardware for this system is designed to be retrofitted into existing LV switchgear and LV panels which enables the network change over to be done cost effectively and with minimum interruption to the network.

The accompanying drawings are incorporated into and form a part of the specification for the purpose of explaining the principles of the invention. The drawings are not to be construed as limiting the invention to only the illustrated and described examples of how the invention can be made and used.

BRIEF DESCRIPTION OF THE FIGURES

Further features and advantages will become apparent from the following and more particular description of the invention as illustrated in the accompanying drawings, in which.

DETAILED DESCRIPTION OF THE INVENTION

Advantageous embodiments of an electromagnetic actuator constituted according to the invention will now be described in further detail with reference to the accompanying drawings.

Figure 1:
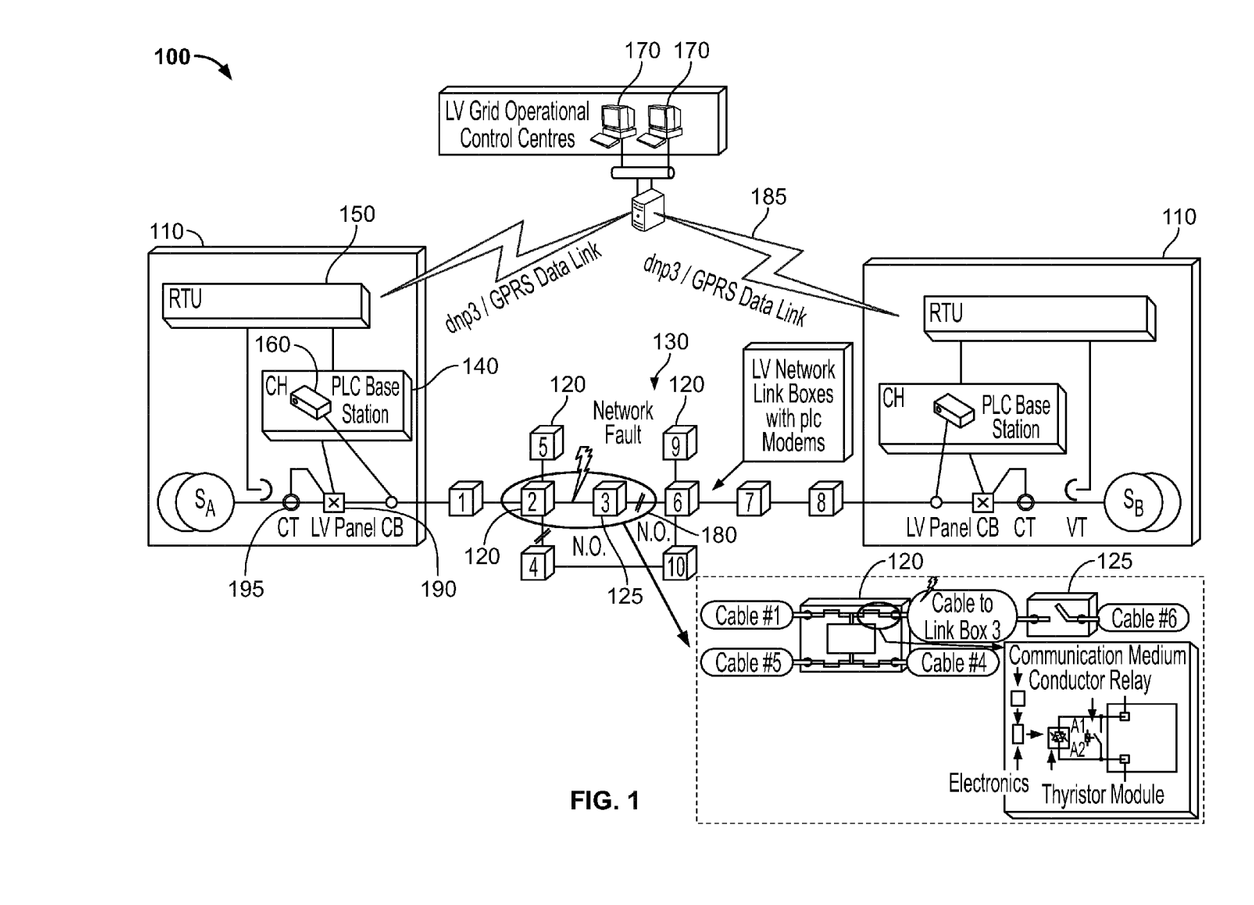
FIG. 1 illustrates schematically an overview of an LV network automation system according to the present invention. The inbox shows schematically a detail of the connections between link box 2 and link box 3 and an exploded view of a disconnect switching device according to the invention.

FIG. 1 illustrates schematically an overview of an LV network automation system according to the present invention.

The LV network automation system 100 comprises one or more MV/LV substations 110. Each MV/LV substation 110 is connected to a switchgear module or link box 120, 125, more specifically, a LV link box 120. The LV network automation system may comprise additional link boxes 120, 125 electrically connected to each other and forming a Link box network 130. The MV/LV substation 110 is connected to one or more power stations (not shown).

As will be described later, each of the wedge links in the LV link box 120 is replaced with a single phase switch 200 that can be remotely controlled using a power line carrier signal from the MV/LV substation 110. Each of these link box switches 200 has its own processor to manage the load-break and fault-make features of the switch and also records the passage of fault current through the switch.

This fault passage information is relayed back from the link box 120 to a communications hub 140 in the MV/LV substation 110 which establishes communications with a remote terminal unit (RTU) 150 associated with the MV/LV substation 110. As will be described later, the RTU 150 and the communications hubs 140 are used in the MV/LV substation 110 to fully automate the control and monitoring aspects of the LV link box network 130. The communications hub 140 further contains PLC base station hardware 160. The information received from the link box 120 is processed to identify the location of the fault on the LV network and is used by utility control room operators at one or more LV Grid operational control centres 170 to decide which switches need to be opened so as to isolate the faulty section 180 of the LV network before restoring power supply to the unaffected sections of the LV network.

The communication between the RTU 150 and the LV grid operational control centre 170 is preferably established wireless via a General Packet Radio Service (GPRS) data link 185 and using DNP3 protocol over TCP/IP. However, other communication means, such as wiring means, and/or other standardized communication protocols suitable known in the art may be used instead.

In addition to monitoring the fault information at each LV link box switch 200, the LV network automation system may also monitor the LV cable voltage and current flowing through the switch including its direction which enables the use of the automated network as a means to manage power flows, particularly from distributed renewable sources which will be connected in the future.

In addition, the MV/LV substation 110 may include a low voltage panel including one or more circuit breakers, which will be referred to in the following simply as a LV panel circuit breaker 190, for automatically interrupting any shorts circuits and overload currents in the network and for switching loads on and off. The LV circuit breaker according to the present invention will be described later.

Fault currents flowing through the LV circuit breaker may be detected by a current transformer (CT) 195 provided in the MV/LV substation 110.

A configuration of a LV link box switch according to the present invention shall now be described with reference to FIG. 2.

The LV link box switch, or simply LV switch 200, comprises a thyristor module 210 connected in parallel with a latching relay 220 which is operated for connecting and disconnecting an AC power signal from a load.

Figure 2:
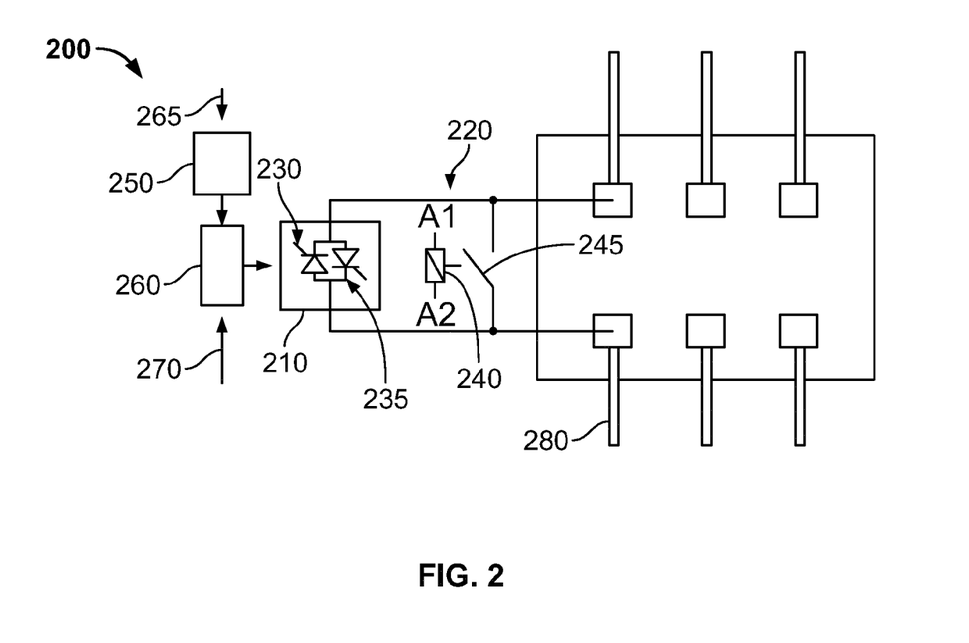
FIG. 2 shows schematically a disconnect switching device according to the present invention.

As shown in FIG. 2 the thyristor module 210 may comprise a pair of thyristors 230, 235 connected in an antiparallel arrangement across the latching relay 220.

The latching relay 220 is preferably a magnetically latching mechanical switch formed by a driving solenoid coil 240 and a mechanical switch 245. The use of a magnetically latching mechanical switch has the advantage that the mechanical switch 245 will stay in the same position even when power is lost on the section of the LV network where the switch is located. Further, no power is consumed to hold the switch closed (or open) and the solenoid coil 240 only needs to be energised for operating the mechanical switch 245.

As shown in FIG. 2, the LV switch 200 comprises a communication means 250 for receiving control signals 265 from the exterior and a control unit 260 such as a processor that controls the switching operation of the LV switch 200 in response to a control signal 265. Other electronic signals 270 may be also received by the control unit 260 from other electronic circuits for controlling other operations, such as the driving of the solenoid coil 240. As will be explained later, the control signal 265 may be a power line carrier control signal.

The switching operation of the latching array/thyristor module arrangement from a load path 280 is controlled by the control unit 260 and is fully described in co-pending PCT/GB/2010/052151

The thyristor module 210 has an Inactive Mode and an Active Mode. Prior to receiving a Switch ON signal the thyristor module 210 resides in the Inactive Mode in which it is in a non-conductive state. As the relay 220 is opened, there is no AC current flow.

Upon receiving a Switch ON signal, the control unit 260 causes the thyristor module 210 to change to an Active Mode in which the thyristor module 210 switches to a conductive state. Accordingly, AC current flow begins to flow through the thyristor module 210. At the same time, a "close" command is sent to the relay 220 for starting its closure process. Current continues to flow in the thyristors until a small number of AC cycles later, when the control unit 260 senses that the relay 220 has closed. The control unit 260 then removes the drive to the thyristors at the first available zero-crossing after the relay 220 has closed, thereby reverting the thyristor module 210 to the non-conducting state. However, as the relay 220 is now closed, AC current flows through the relay 220, and the LV switch 200 is now "ON". In this scenario, the relay 220 has closed in an "off load" condition, and so there is no arc flashover to damage the relay contacts.

When the relay 220 is closed and prior to receiving a Switch OFF signal for closing the LV switch 200, there is AC current flowing through the relay 220 and the thyristor module 210 resides in the non-conductive state.

Upon receiving a Switch OFF signal, control unit 260 causes the thyristor module 210 to change to an Active Mode in which the thyristor module 210 is in a "latent" conduction mode, so that it can conduct AC current as soon as the relay contacts open. The control unit 260 sends a burst of pulses to the thyristor module 210 to turn the thyristors on at the zero crossings of the AC current and keep the thyristors in a conductive state. At the same time, the control unit 260 sends an "open" command to the relay 220, starting its opening process. AC current continues to flow in the relay 220 until, after a few AC cycles, the relay 220 opens. Immediately, the AC current begins to flow through the thyristor module 210.

The control unit 260 will now have detected that the relay contacts have opened, and at or just prior to the first subsequent AC zero-crossing will remove the drive from the thyristor module 210, which causes the thyristor module 210 to revert to the non-conducting state at the zero of AC current. As the relay 220 is opened, no AC current flows through the relay 220, and so the LV switch 200 is now OFF. In this scenario, the relay 220 has opened in an "off load" condition, and so there is no arc flashover to damage the relay contacts.

Thus, when the LV switch 200 is being opened or closed, the control unit 260 fires the thyristors to provide an alternative path for the flow of the load current and prevent arcing at the contacts within the LV switch 200. This increases the number of mechanical operations the contacts can perform.

However, when the LV switch 200 is performing a closing operation it could be possible that very high fault currents flow due to the presence of a prior fault on the un-energised network.

In order to avoid failure of the thyristors in case these currents exceed the surge overload current rating of the thyristors, a novel method for energizing the network is achieved by closing the thyristors just prior to the zero crossing point of the voltage and the thyristor will switch off automatically at the zero crossing point.

According to the energizing method, while the thyristor is energized the load current flowing in the circuit is measured.

If this load current is within a normal range of switching load currents, a closing operation sequence is initiated in which an additional firing of the thyristor will take place just prior to the next zero voltage crossing point and at a timing that will be incrementally earlier from the zero crossing point used for the first thyristor energisation. Thus, after the first thyristor energisation, each subsequent firing takes place at an instant of time, with respect to the next zero voltage crossing point that differs from the immediately preceding firing instant by a predetermined time increment.

This firing process is repeated for each consecutive zero crossing until a stage is reached when the thyristors are conducting for the full duration of the half cycle. At this stage the control unit 260 provides a driving signal to a solenoid drive circuit (not shown) of the latching relay 220 to close the mechanical switch 245.

If the measured current exceeds a threshold level during any of the stages of the thyristor energisation cycles described above, then the control unit 260 abandons the closing operation sequence and no longer fires the thyristors prior to the zero crossing point. Further, no driving signal will be sent to the solenoid drive circuit to close the mechanical switch 245 as illustrated in FIG. 3.

Figure 3:
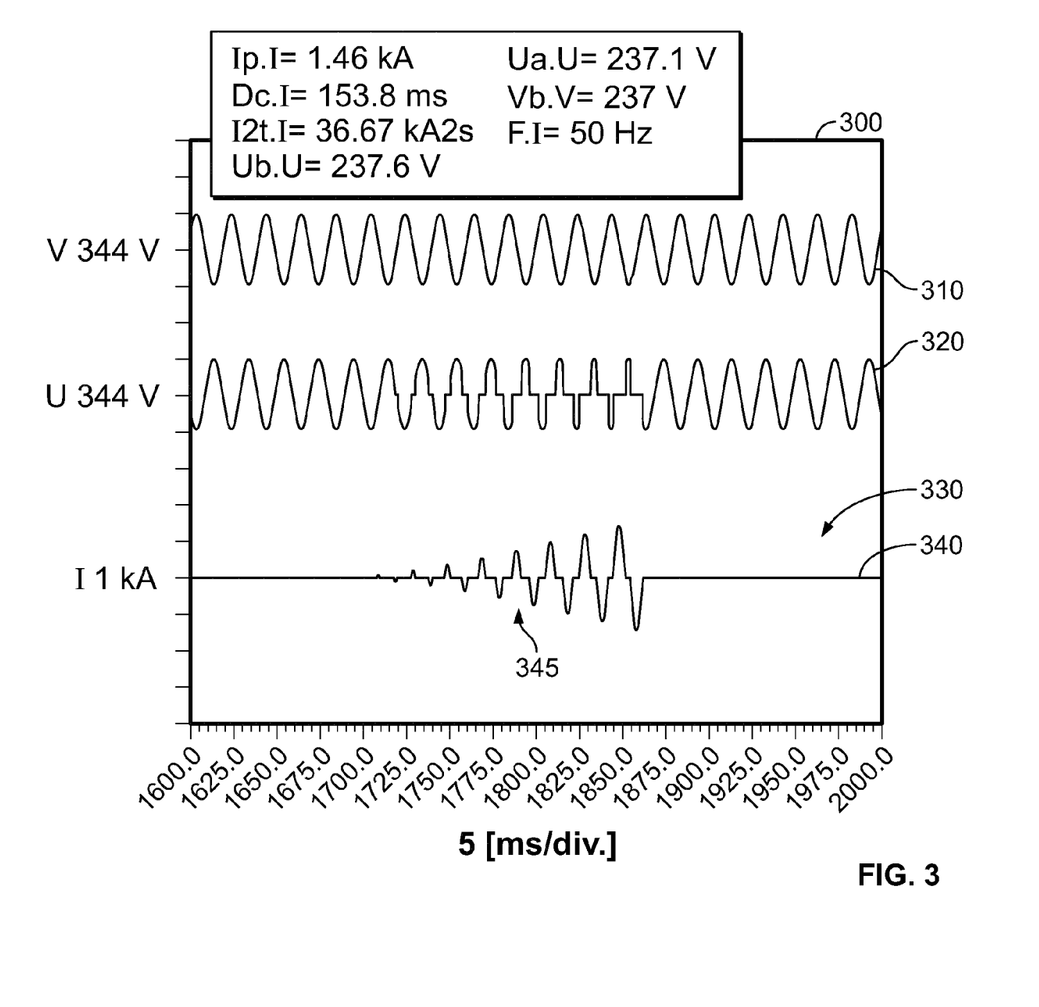
FIG. 3 shows a graph of measurement results as function of time and obtained during a fault-make thyristor energisation sequence according to the present invention.

FIG. 3 shows a graph 300 of measurements results as a function of time that were obtained during a Fault make energisation sequence such as described above. The upper curve 310 shows the variation of the AC power source, the curve 320 in the centre shows the voltage across the device and the lower curve 330 shows the current flowing through the thyristor module 210 when the thyristor module 210 is in the non-conductive state (flat part 340) and when the thyristors are sequentially fired as described above (oscillating part 340).

This energising method has a number of advantages as it reduces the stress on cables and transformers during a fault closing operation, and reduces risk of damage to third party assets in contact with the faulted network cable.

Figure 4:
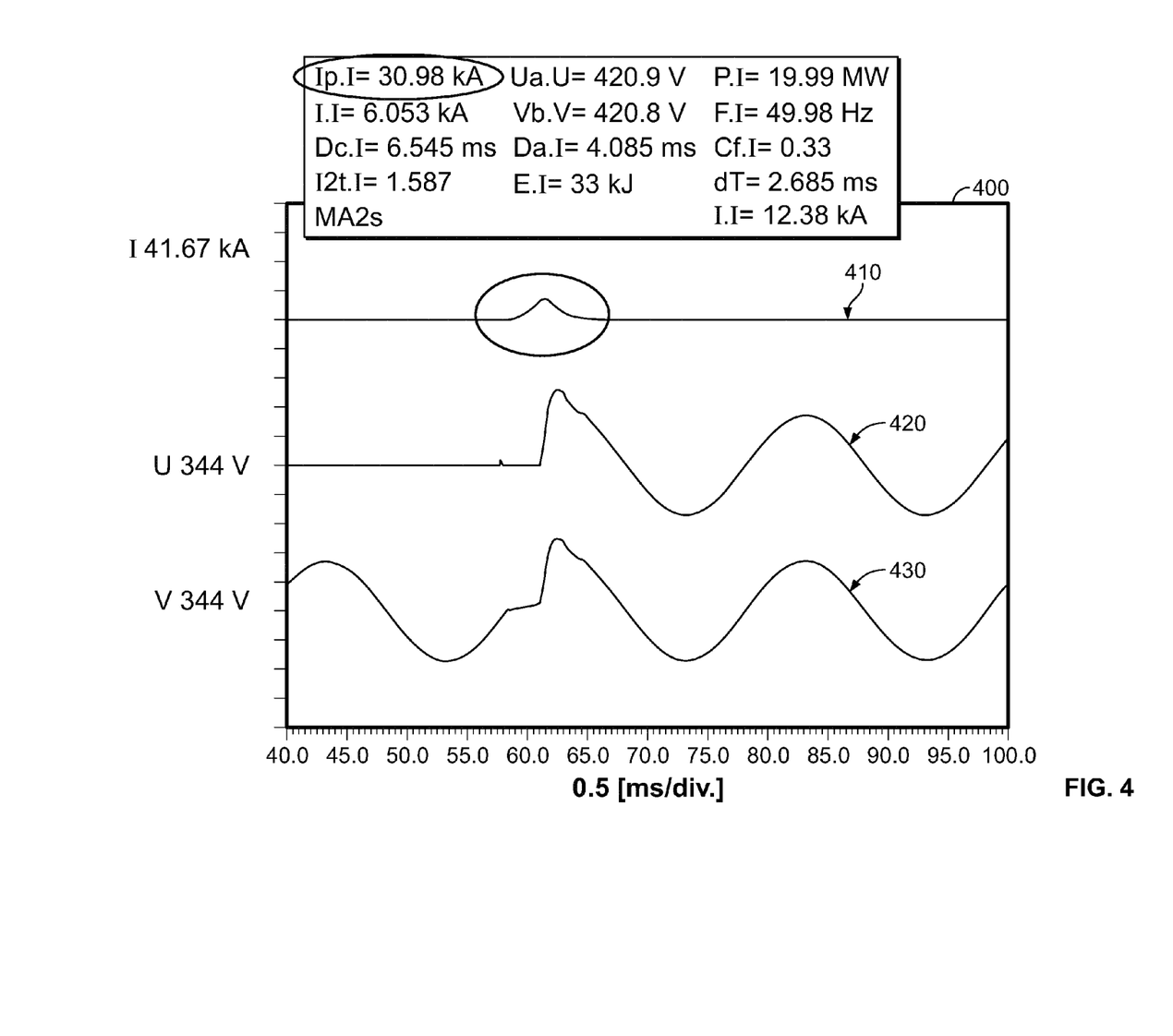
FIG. 4 shows measurement results obtained for a conventional fusing operation using a 400 A fuse to interrupt a network fault having a prospective fault rating of 50 kA network fault.
Figure 5:
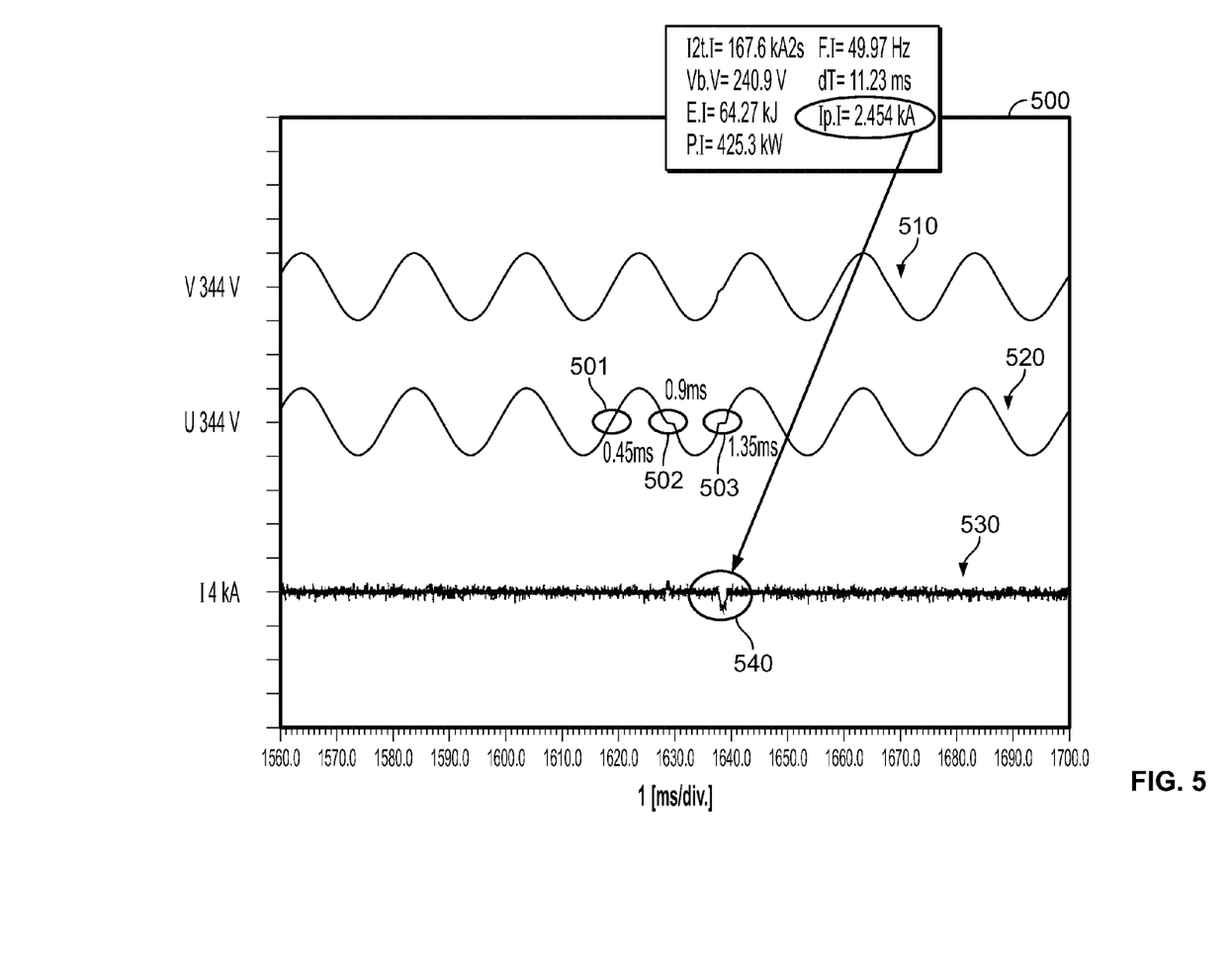
FIG. 5 shows measurement results obtained using a fault-make thyristor energisation sequence according to the present invention for interrupting a network fault having the same prospective fault rating of 50 kA network fault.

Results of tests conducted in the for comparing the difference between currents which flow when using a 400 A fuse to interrupt a network fault having a prospective fault rating of 50 kA network fault and the currents which flow when using the Fault-make method of the invention to energise a network with a similar prospective fault current are illustrated in FIGS. 4 and 5, respectively.

The results shown in the graph 400 of FIG. 4 were obtained for a fusing operation when using a 400 A fuse that limited the peak fault current to 30.98 kA and with a fault current duration of 6.55 ms. Total $I^2t$ during the fusing operation was 1.587 $MA^2$ s. In FIG. 4, the upper curve 410 shows the load current, the centre curve 420 shows voltage across the fuse and the lower curve 430 shows source voltage.

FIG. 5 shows a graph 500 of measurement results as a function of time, and in which the upper curve 510 shows the variation of the AC power signal from the source, the curve in the centre 520 shows voltage across the switching device and the lower curve 530 shows the current flowing through the thyristors. These measurement results were obtained using a Fault-make thyristor energisation sequence for which three successive thyristor firing sequences 501, 502, and 503, are used with durations 0.45 ms, 0.9 ms and 1.35 ms, respectively. The maximum peak current 540 which flowed was 2.45 kA and the total $I^2t$ during the fault-make operation was 0.168 $MA^2$ s. These values represent 8% and 10.6% of the respective quantities obtained in the 400 A fusing operation.

Results obtained using the two methodologies described above are summarized in Table 1.

TABLE 1

Comparison of 400 A fusing and fault-make thyristor energisation methodologies

| Methodology | Peak Current | | Total $I^2t$ | | Duration of Fault current |
|---|---|---|---|---|---|
| 400 A fusing operation | 30.98 kA | 100% | 1.587 $MA^2s$ | 100% | 6.55 ms |
| Fault-make thyristor energisation sequence | 2.45 kA | 8% | 0.168 $MA^2s$ | 10.6% | 2.70 ms |

Additional safety features may be provided to a technician operating the switches to avoid closing the switch for each of the following cases:

Switch will not close if there are two different phases on opposite poles of the switch. This may be achieved by checking the voltage on both sides of the switch before closing or by measuring the time difference between the zero voltage crossings of the voltage on both sides. This prevents the switch creating a phase-phase fault on the network. Should this be the case an alarm will indicate the presence of a phasing error and the switch will not close;

Switch will not open if load current exceeds the rated switch load break capacity. This is achieved by verifying the load current before commencing a switching operation and allows preventing damage to the thyristors. In this case the fault current will be cleared by protective devices upstream such as a circuit breaker or fuse; and Local operation of switches using individual ON/OFF buttons. The buttons must be pressed for 5 s continuously to avoid any un-intended accidental operations and the operation of the switches will have a time delay (initially set to 10 s in firmware) to allow operator time to move away from the switch in case of fault, etc.

The above safety features may be provided alone or in combination.

The switch control and communications with the link box 120 will now be described with reference to FIGS. 6A and 6B.

The LV switches 200 described above function as a load-break/fault-make disconnect switch, also referred to as LB/FM switch disconnect, and are designed so that they can be fitted into existing link box designs and easily removed if necessary. The LB/FM switch disconnect is not to be cast into the LV link box 120 in a resin.

Each LV link box 120 is fitted with removable LB/FM switch disconnects, which are retrofitted into the link box 120 and remotely controlled using power line carrier (plc) control signals 265.

Figure 6A:
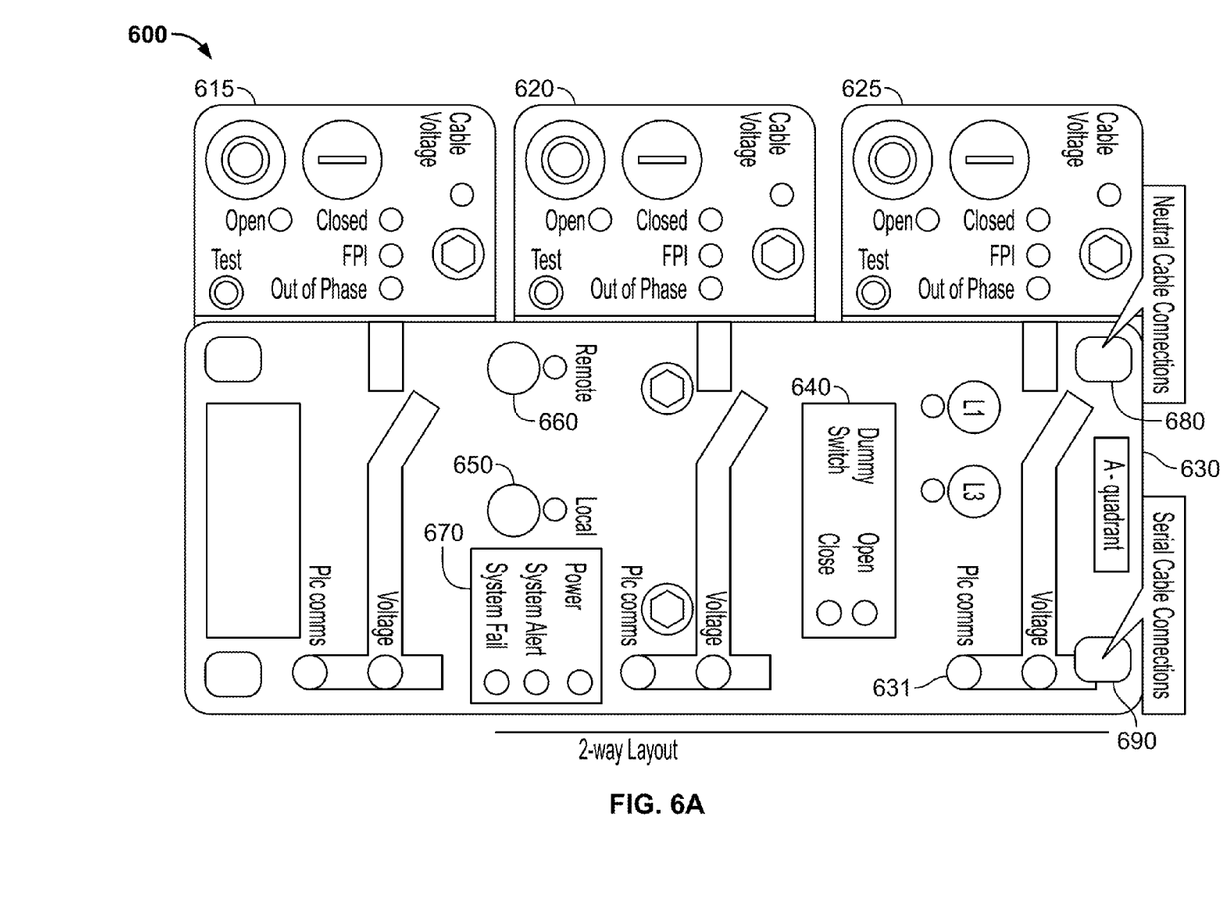
FIG. 6A and FIG. 6B show a switch layout of a 2-way link box and a 4-way link box, respectively, according to the present invention.

FIG. 6A illustrates a switch layout of a 2-way link box 600 fitted with three removable LB/FM disconnect switches 615, 620, 625. An example of 4-way link box 610 fitted with twelve removable LB/FM switches is illustrated in FIG. 6B.

The LV link box 120 comprises a master module 630 that provides communications and command functionality for all LB/FM switch disconnects in the link box 120. The master module 630 is located in quadrant A.

RS-485 communication connections (not shown) are made to each switch in other quadrants from this master module 630.

The communications of the master module 630 with the MV/LV substation Remote Terminal Unit 150 are performed using power line carrier communications. For a 4-way link box the power line carrier connections are made on the bus bar side only.

One power line carrier modem 631 per phase is provided per link box 120 in the master module 630. Thus, if plc communications are lost to the master module 630 from one or two of the phases, auxiliary communications control planes are provided on the other phase connections. Backup communications with the link box 120 may then be provided on the available phases.

A dummy switch 640 including replica processor and electronics used in the switch may be provided and located in the master module 630. This is used to verify operational performance from SCADA.

A Local switch 650 and a Remote switch 660 may be provided in the link box 120 for allowing disabling and enabling remote SCADA communications, respectively. Alternatively, the function of these switches may be implemented by a single Local/Remote switch.

A slave module is present in each quadrant. The slave module contains the power supply units for each of the LB/FM switch solenoid drive circuits, plus the power supply unit for the electronic control board.

One phase is usually available in the link box 120 to provide power supply for other switches. The power supply module may be configured so as to auto select a power supply source from an available phase.

Each slave module has three processors which control the operation of the thyristor switching operations described above. In addition these processors sample load current and voltage and store these records for retrieval by the RTU 150 of the MV/LV Substation 110 when requested.

If a fault current passes through the link box switch 200 it is registered as an alarm event and the details are passed to the communications hub 140 in the MV/LV substation 110 over the plc communications network. The alarm event may be signalled to an operator by an alert indicator 670 provided in the master module 630.

Each link box quadrant 600 is also provided with insertions for neutral cable connections 680 and for serial cable connections 690 with other link box quadrants.

Figure 6B:
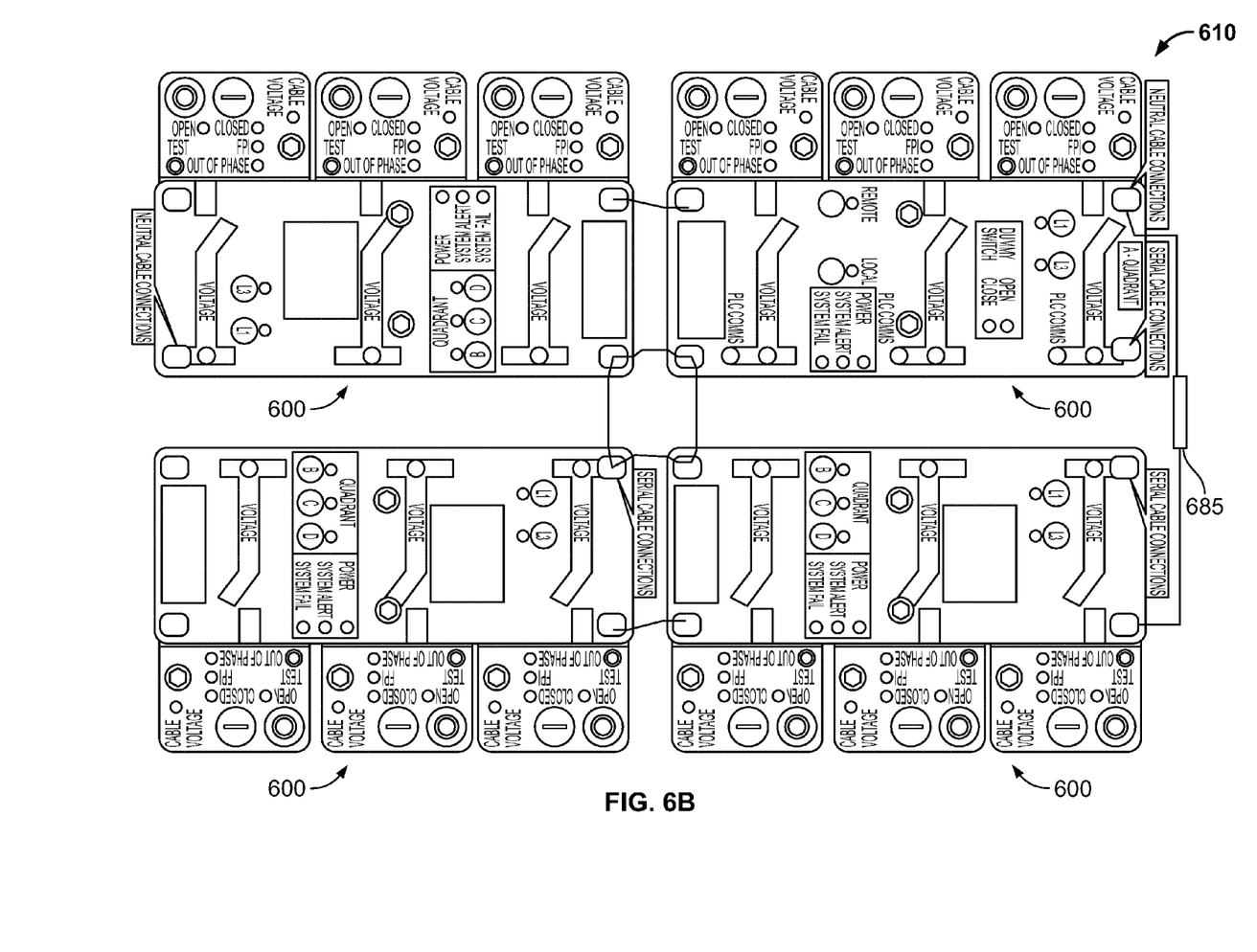

For instance, as shown in FIG. 6B, all four link box quadrants 600 are serially connected with each other while a neutral connection 685 is established between two of the link boxes 600.

A configuration of a LV single phase circuit breaker device 700 according to the invention will now be described with reference to FIG. 7.

The single phase circuit breaker device 700, which will be referred to in the following as LV circuit breaker 700, can be retrofitted to LV fuse boards or panels, such as fuse boards which use J-tag fuses with 92 mm centre-centre spacing, to provide protection for the LV feeder circuits as well as measure load currents and voltage on each individual feeder.

Figure 7:
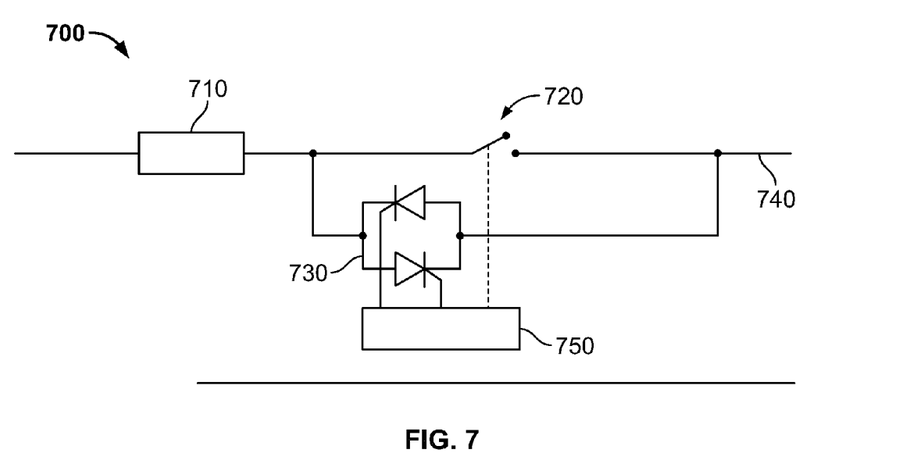
FIG. 7 shows a block diagram of a LV circuit breaker according to the invention.

As shown in FIG. 7, the LV circuit breaker 700 uses the same thyristor switching technology as the link box switch 200 described with reference to FIG. 2, but the overload current ratings of the thyristors used are much higher than those used for the link box switch 200.

In addition, the LV circuit breaker 700 comprises an overcurrent protection device or a fuse 710, for instance, a 315 A or 400 A LV J-tag fuse, which is connected in series with a switching arrangement comprising a latching relay 720 connected in parallel with a thyristor module 730 such as described above. The purpose of the fuse is to provide additional backup protection and also to clear network faults above the overload current rating of the thyristors.

In this configuration, the latching relay/thyristor switching arrangement is used to clear fault currents flowing in the load path 740 up to a certain threshold level, for e.g. 6 kA rms, and the fuse is used to clear fault currents above this level. Existing network safety and protection is guaranteed by this arrangement.

The LV circuit breaker 700 also comprises a controller 750 such as a processor that controls the operation of the latching relay/thyristor switching arrangement. Further, the controller samples the fault current at a predetermined timing, for instance, 256 times per cycle, and depending on the level of the fault which is present it will determine if the thyristors or the fuse should clear the fault. The operating time characteristic of the LV circuit breaker 700 is matched to the fuse operational curve.

Figure 8:
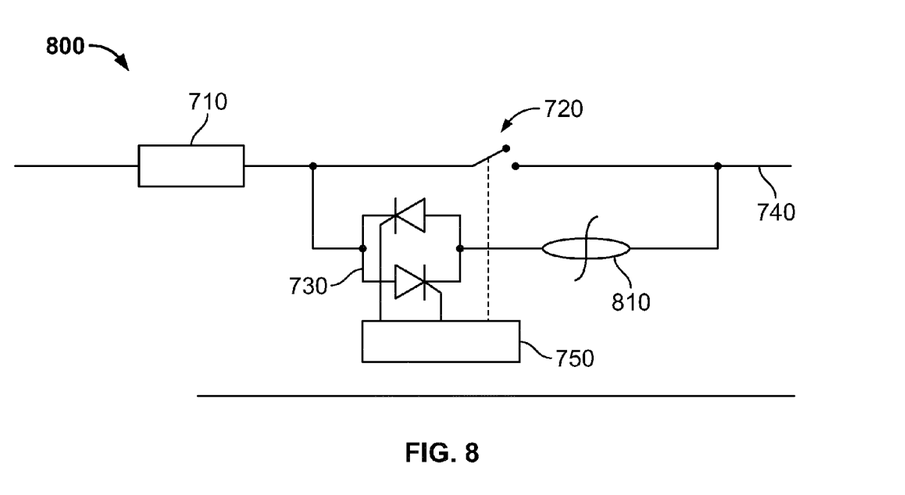
FIG. 8 shows a block diagram of another LV circuit breaker according to the invention.

FIG. 8 illustrates an alternative configuration of a LV circuit breaker 800 according to the invention for protecting power feeder lines in electricity distribution network.

This configuration differs from the LV circuit breaker 700 shown in FIG. 7 in that it comprises an additional overcurrent protection device 810 inserted in series with the thyristor module.

The additional overcurrent protection device is preferably a positive temperature coefficient (PTC) thermistor, simply referred to as a PTC device 810, whose resistance varies significantly with temperature and/or when the current flowing through the PTC element 810 is significantly increased.

In case of a short circuit, the controller senses the fault current and decides whether to open the contacts of the latching relay or to blow the fuse. If the controller decides to open the contacts, the thyristors are switched on to prevent arcing, then the contact is open and the thyristor is switched off at the first zero cross.

The insertion of the PTC device 810 in series with the thyristor module allows limiting the current flowing through the thyristors, which can otherwise fail above a moderate fault current (2.5-5 kA), in case of large short circuit currents Under normal operating conditions of distribution networks, the load current ranges from 400-800 A and the operating voltage is 240 Vac/50 Hz for the UK and 110 Vac/60 Hz for the US.

Thus, it is desirable to achieve a protector rating of 9-10 kA, 15 kA or preferably 25 kA. The dimensions of the PTC element 810 are preferably selected so as to allow the PTC element 810 to be accommodated underneath the thyristor module 210.

Figure 9:
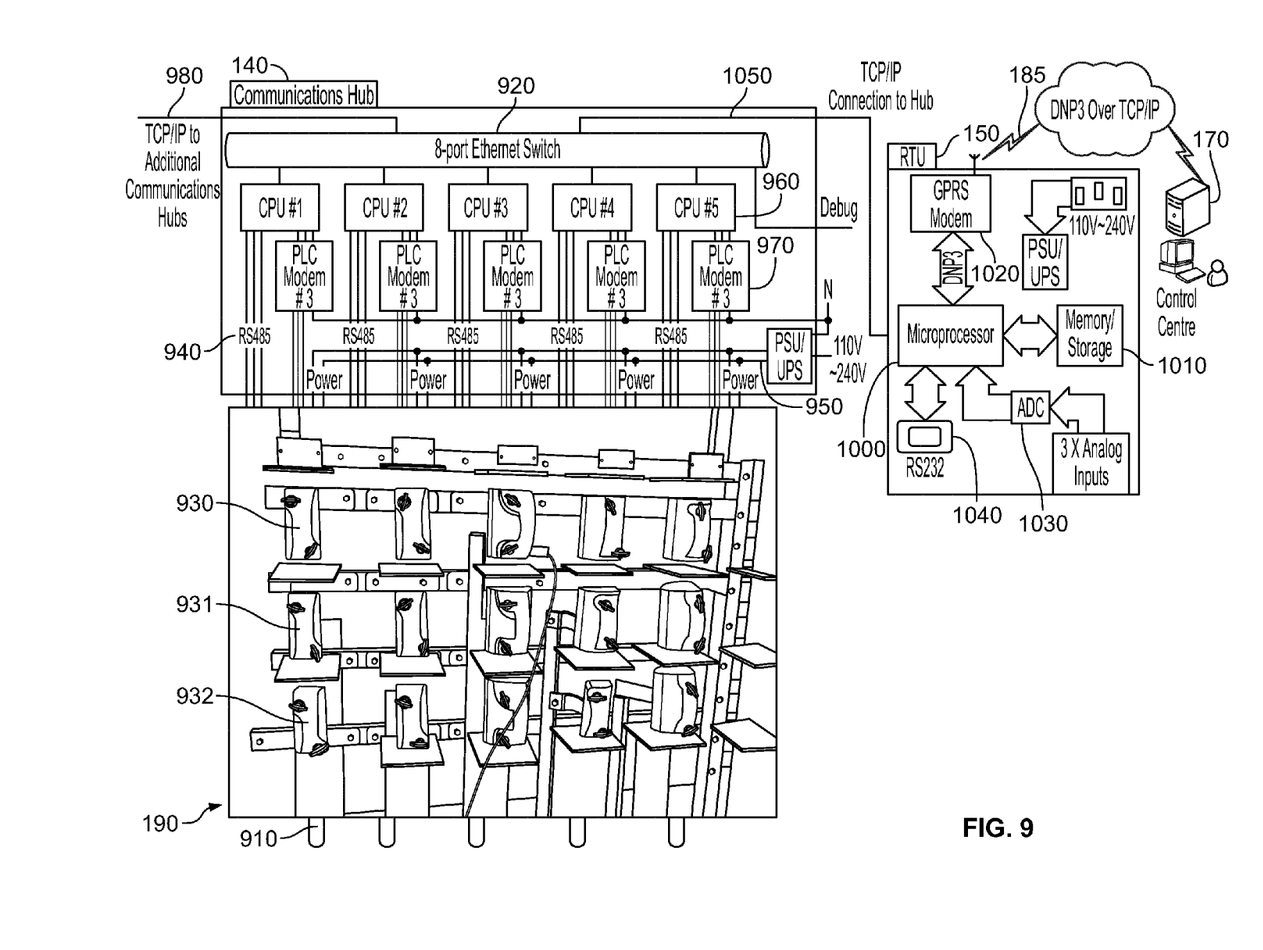
FIG. 9 shows a block diagram of a remote terminal unit and a communications hub according to the present invention.

FIG. 9 shows a block diagram of a Remote Terminal Unit (RTU) and a communications hub according to the present invention.

The RTU 150 and communications hubs 140 are used in the MV/LV substation 110 to fully automate the control and monitoring aspects of the LV link box network 130 and have the capability to monitor various measurements and levels directly within the sub-station itself pertaining to the LV network.

The RTU 150 is preferably designed so as to ensure there will be no interference with other existing equipment within the MV/LV substation and so as to comply with relevant standards and directives.

The RTU 150 and communications hubs 140 are preferably provided with a fully compliant Supervisory Control and Data Acquisition (SCADA) interface to either an existing host system or a separate new system deployed solely for the LV network.

The DNP3 protocol is preferably used as the control plane protocol between the SCADA Control Plane and the RTU 150.

Nevertheless, the RTU 150 and communications hubs 140 may also be implemented without a SCADA control plane. For instance, a direct connection to the web servers in the RTU 150 over GPRS and a remote web server application to receive alarm indications may be provided.

Each communications hub 140 can be connected to port connections of the LV panel circuit breaker 190 and is adapted to control a plurality of feeders 910 such as 5 feeders as shown in FIG. 9.

Each feeder 910 is a multi-phase signal cable, in the illustrated example a 3-phase signal cable. The RTU 150 is then designed to control 3×the number of feeders 910 connected to the communications hub 140, in the illustrated example, 15 feeders 910.

The communications hub 140 may be modular in design and a number of hubs may be connected to allow more than 5 cables to be controlled in each MV/LV substation.

Alternatively, the communications hub 140 might be upgraded and/or downgraded to support more or less feeders, respectively.

The communications hub 140 may manage the control of the communication links both serial and the power line carrier 3-phase cables.

As mentioned above, power line carrier signals are used for communication from MV/LV substation with the underground link box switching devices. The communications hub 140 comprises an 8-port Ethernet switch 920, which provides the interface to the power line carrier network controlling and monitoring the automated LV link box network 130.

In addition, the communications hub 140 is adapted to be connected to port connections provided in the LV panel circuit breaker 190 for controlling each LV circuit breaker device 930.

The LV panel circuit breaker 190 shown in FIG. 9 has 5×3 LV circuit breaker devices. A RS 485 connection (multi-drop) is provided between each of the 3 LV circuit breaker devices 930, 931, 932 on a single cable way. Each LV circuit breaker device may have a Modbus address which is associated with the phase, e.g., 1, 2, and 3. Power supply cables 950 for the electronics of the LV panel circuit breaker 190 and drive mechanism may also be provided on the communication hub.

Each feeder 910 is associated with a dedicated control processing unit (CPU) 960 and a PLC modem 970 for each of the phases of the multi-phase signal, in the illustrated example, for each of the 3 phases. PLC connections are connected to outgoing way on each LV circuit breaker.

The Ethernet switch 920 may also be implemented with a TCP/IP connection 980 for communications to additional communications hubs 140.

As shown in FIG. 9, the RTU 150 comprises a processing unit such as a microprocessor 1000, storage means such as a memory 1010 and a communication means such as a GPRS modem 1020, for establishing communications with the LV Grid control centre 170.

Communications between the GPRS modem and the microprocessor are preferably performed using DNP3 or IEC SCADA protocols. However, other suitable standardised protocols might be used.

Communications between the RTU microprocessor 1000 and the communication hub 140 are also provided, preferably, using a TCP/IP connection 1050.

An analog-digital conversion (ADC) unit 1030 is also provided for converting current or voltage analog input signals and feed them to the microprocessor unit. A RS232 port 1040 may also be provided in the RTU 150.

The RTU 150 may be programmed to identify the location of a faulted network section and present an operator with an option to open the switch upstream of the fault before replacing the blown fuse. Further, the location of the switch helps the operator to identify the location of the fault and to isolate the faulty section 180 from the rest of the distribution network. Thus, once the switch upstream of the fault has been opened it allows the operator to re-close onto a network in the knowledge that the faulted section of network has been isolated and thus avoid closing a fuse onto a faulted network.

In order to allow fault detection and isolation, the LV circuit breakers and Link box switches may generate autonomous fault events to the RTU 150. The SCADA control platform is implemented to enable spontaneous reporting of specified data objects via the DNP Configuration Function of Enable Unsolicited Messages.

The RTU 150 may also support local processing of fault location details in order to minimize DNP3 traffic over the communications link to the SCADA control platform. At the RTU 150, data object faults may be reported over the DNP 3 interface via Internal Indications (INN) with the relevant Class 1-3 data available bits set.

Load monitoring may be performed on a sample basis at LV panel and link box level. Sample frequency for devices can be selected at control room level to optimize communication traffic. Fault and control signals override any load monitoring traffic.

Load monitoring characteristics as specified above shall be reported as Class 3 DNP3 pulse counter events. The SCADA control platform may use the DNP Freeze with Time Function to capture load information e.g. voltage and current sensor readings at a pre-defined time interval.

A typical time interval may be 8 hours, however the SCADA control platform may select a lower interval such as 1 hour, if it wishes to monitor a particular segment of the network. The following set of measurements may be provided, alone or in combination:

1. RTU Measurements: Phase L1 Voltage, Phase L2 Voltage, Phase L3 Voltage, and/or Average GPRS Signal Strength over 24 hrs;
2. Circuit Breaker Measurements: Current and/or Voltage Measurement; and
3. Linkbox Switch Measurements: Voltage Measurement and/or Current Measurement.

Thus, the LV network automation system 100 enables an operator on the control centre 170 to monitor load flows on the LV networks and identify circuits which are overloaded and gives control room operator options for redistribution of network load where possible. This enables utilities to potentially reduce losses on their LV networks and provides them with the tools to manage integration of renewable energy sources and Electric Vehicles on the LV grid.

The PLC base station (BS) 160 may be implemented for setting and/or managing PLC Base Station policies.

A PLC Base Station Admission Policy may be applied at the LV Panel breaker 190 based on having all LV circuit breakers 930 and Link box switches 200 configured with a unique identification information. Preferably, the unique identification information is a serial number set at manufacturing stage. At the Base Station, the PLC Admission Policy will be set to App mode (using Serial Number). Therefore, admission will be based on a list of provisioned Remote Station Serial Numbers by the SCADA control room operator.

PLC Remote Station (RS) Admission principles at the Link box switches 200 may require that at manufacturing time, all LV panel circuit breakers 930 and Link box switches 200 are configured with a same Node Key. Preferably, a 8 byte Node Key may be used. During the PLC Admission process, the Base Station 160 will return its Node Key to the Remote station 150. The Remote Station 150 will only accept a Base Station 160 that has exactly the same Node Key. For instance, the Node key may be set so that the RS 150 will only communicate with a LV Automation System Base Station.

The Link box switches 200 may support Report by Exception (RBE) mechanism to communicate autonomous events from Link box switches 200 to LV panel breaker circuits 930.

Although the above embodiments were described with reference to a SCADA interface control platform and DNP3 protocol, the present invention may be implement using other control platform and standardized protocols which are suitable for the same communication and control purposes.

The invention claimed is:

1. A switchgear module for a power distribution network, comprising:
   a disconnect switching device provided for each phase of a multi-phase AC power signal;
   a power line carrier receiver for each phase and adapted to receive a power line carrier, "PLC", control signal from a remote substation for controlling the disconnect switching device;
   a master module adapted to communicate with the disconnect switching devices and the power line carrier receivers and to control the disconnect switching devices using the received PLC control signals; and
   a low voltage panel breaker configured to connect and disconnect the AC power signal to a load, the low voltage panel breaker including an overcurrent protection device configured to disconnect the AC power signal from the load when a fault current condition occurs at a current value that is above a predetermined threshold value;
   wherein if a PLC control signal is not received by a power line carrier receiver, the master module is adapted to control the respective disconnect switching device using a PLC control signal received by another power line carrier receiver.

2. A switchgear module of claim 1, wherein the low voltage panel breaker comprises a thyristor switching device for connecting and disconnecting the AC power signal to the load.

3. An automation system for a low voltage distribution network, comprising the switchgear module of claim 2 and further comprising a remote terminal unit adapted to remotely control and monitor the switchgear module and the low voltage panel breaker.

4. The automation system of claim 3, comprising:
   a power line control base station; and
   a communications hub adapted to provide communications between the remote terminal unit with the low voltage panel breaker and the switchgear module.

5. The automation system of claim 3, wherein the remote terminal unit is adapted to identify a location of a faulty section on the network and to allow remotely opening a switch located at the corresponding location for isolating the faulty section.

6. The automation system of claim 4, wherein a PLC Base Station Admission policy is applied at the low voltage panel breaker, the PLC admission policy being set at the base station using a unique serial identification information that identifies the disconnect switching devices of the switchgear module and the circuit breakers of the low voltage panel breaker.

7. The automation system of claim 4, wherein a PLC Remote Station admission policy is applied at the switchgear module, which is set using a node key, wherein the disconnect switching devices of the switchgear module and the circuit breakers of the low voltage panel breaker are configured with the same node key.

8. The automation system of claim 4, wherein the base station is adapted to return its node key to the remote station during a PLC Admission process and the remote station is adapted to only accept a base station having the same node key.

9. The automation system of claim 3, further comprising a current transformer connected to the low voltage panel circuit-breaker for detecting current fault conditions and/or monitoring a network load.

* * * * *